United States Patent [19]

Lee et al.

[11] Patent Number: 5,027,055
[45] Date of Patent: Jun. 25, 1991

[54] COMPACT OPTICAL RF SPECTRUM ANALYZER

[75] Inventors: John N. Lee, Silver Spring, Md.; Carl M. Verber, Atlanta, Ga.

[73] Assignee: The United States of America as represented by the Secretary of the Navy, Washington, D.C.

[21] Appl. No.: 463,063

[22] Filed: Jan. 10, 1990

[51] Int. Cl.$^5$ .............................................. G01R 23/16
[52] U.S. Cl. ................................. 324/77 K; 350/96.11
[58] Field of Search ............................ 324/77 K, 77 B; 310/313 D; 350/96.11, 96.13, 96.19; 333/141, 150, 153

[56] References Cited

U.S. PATENT DOCUMENTS

| | | | |
|---|---|---|---|
| 4,253,060 | 2/1981 | Chen | 324/77 K |
| 4,511,206 | 4/1985 | Thylen et al. | 324/77 K |
| 4,575,179 | 3/1986 | Lee et al. | 350/96.13 |
| 4,762,735 | 8/1988 | Gregoris et al. | 350/96.11 |
| 4,776,661 | 10/1988 | Handa | 350/96.19 |
| 4,801,872 | 1/1989 | Kitano | 350/96.11 |

Primary Examiner—Hezron E. Williams
Assistant Examiner—Louis M. Arana
Attorney, Agent, or Firm—Thomas E. McDonnell; George Jameson

[57] ABSTRACT

An improved compact optical and rugged laser-driven RF spectrum analyzer being made up of slab-like waveguide means. The waveguide means has at one end enhanced surface diffraction grating means for intercepting and selectively diffracting a laser source beam so that the diffracted laser beam is deflected, expanded and focussed to converge toward the other end and in relation to both a surface acoustic wave (SAW) and detector array means. The waveguide means includes novel combined signal detection and arcuate-shaped transducer (CSD/AT) means between its ends for forming and directing the SAW in response to a detected RF (microwave) signal to be analyzed such that the SAW optically intercepts, interacts and further diffracts in Bragg-Cell-like fashion that converging beam so as to deflect same relative to detector array means at the other end of the waveguide means. The detector array means normally analyzes a series of differently deflected beams so as to provide frequency distribution and intensity of one or more detected signals. A second surface diffraction grating means can be provided on the waveguide means and interposed between the first surface diffraction grating means and the CSD/AT means so as to compensate for aberrations in the converging beam that might otherwise interfere with the detector array means analysis of an optically diffracted source beams.

16 Claims, 4 Drawing Sheets

COMPACT OPTICAL RF SPECTRUM ANALYZER

This invention relates to a laser-driven RF spectrum analyzer having surface diffraction means for diffracting a laser beam and a surface acoustic wave intercepting the diffracted beam so as to enable analysis of a detected RF signal and, more particularly, it concerns an improved laser-driven and compact optical RF spectrum analyzer having enhanced surface diffraction means for selectively diffracting, expanding and focussing (converging) a laser beam prior to the diffracted beam intercepting a novel surface acoustic wave arrangement where the wave thereof is indicative of a detected RF signal and further diffracts the intercepted beam so that it is further deflected for detection by detector array means of the RF spectrum analyzer thereby enabling analysis of the frequency distribution and intensity of the detected signal.

BACKGROUND OF THE INVENTION

Various designs have been developed in the past in providing a number of spectrum analyzers to meet different requirements. For example, U.S. Pat. No. 4,253,060 to Bor-Uei Chen relates to a laser-driven and optical RF spectrum analyzer of one-piece slab-like construction and L-shaped configuration. The analyzer is generally comprised of waveguide means integrally formed on the upper exposed portion thereof. A diffraction grating of conventional design is located at the intersection between the leg portions of the L-shaped analyzer. A beam focusing lens is also formed in the waveguide between the wave transducer means and the detector array means. The lens serves to focus the diffracted and optically deflected beam on the detector array means for analysis thereby. U.S. Pat. No. 4,575,179 to John Lee et al. concerns an optical signal processor of integrated construction for diffracting light waves by way of intercepting magnetostatic waves. The processor is generally made up of optical signal input prism means, surface waveguide means and optical signal output prism means. The species of FIG. 1 is considered pertinent and is provided with spaced input/output prism means for coupling/decoupling a collimated optical beam to the waveguide means for enabling diffraction thereof. An appropriate strip-line antenna means is formed in the waveguide means and arranged between the input/output prism means. The antenna means is connected to signal detection means such that when the detection means receives a signal to be analyzed, the antenna means in response to the signal generates a magnetostatic wave for modulating the optical beam. U.S. Pat. No. 4,776,661 to Y Handa relates to an integrated optical device. The species of FIG. 21 is deemed pertinent and is generally made up of a combined channel-like optical waveguide and diffraction means and a slab-like surface optical waveguide means. The waveguide means is provided with wave transducer means for generating a surface acoustic wave (SAW) in response to an electrical signal input to be analyzed. A light beam source is connected to the combined waveguide and diffraction means such that the diffracted and collimated beam is intercepted and modulated by the SAW so as to deflect same and enable analysis thereof. However, none of the aforediscussed references whether taken alone or in any combination suggest the improved laser-driven compact optical RF spectrum remotely analyzer of slab-like block construction and simplified design that incorporates an enhanced diffraction grating means of unique design as formed in the optical surface waveguide means thereof. The grating means causes the formation of a novel expanded and diffracted laser beam of enlarged diametrical extent than heretofore possible and with the expanded beam advantageously converging without requiring a focusing lens. At the same time the diffracted beam is modulated and deflected in response to a surface acoustic wave of a novel combined signal detection and arcuate-shaped transducer (CSD/AT) means of the analyzer as the result of a detected signal so that the deflected beam may be analyzed for determining the frequency distribution and intensity of the detected signal.

SUMMARY OF THE INVENTION

An object of the invention is to provide an improved optical RF spectrum analyzer of slab-like block construction and integrated, compact and rugged design that is easily fittable because of its compactness into an integrated circuit design.

Another object of the invention is to provide an improved optical RF spectrum analyzer of slab-like block construction and integrated compact and simple design that minimizes its manufacturing requirements by reason of its compactness and simplified design.

Still another object of the invention is to provide an improved laser-driven optical RF spectrum analyzer of one-piece slab-like block construction and integrated design and is provided with source-beam diffraction grating means that not only diffracts and deflects the beam the full length of the grating means so as to provide for an expanded diffracted beam but the spacing between adjoining gratings progressively increases along the length of the grating means thereby chirping the phase of the source beam where the rate of chirping by the diffraction grating means is related to the converging and focussing (focal length) of the expanded/diffracted beam.

And still another object of the invention is to provide an improved laser-driven optical RF spectrum analyzer having waveguide means and novel combined signal receiving and arcuate-shaped transducer means for detecting, receiving and transforming a signal to be analyzed wherein the combined means is disposed immediately adjacent the enhanced diffraction grating means (since there is no focussing lens) and along one edge of the waveguide means thereby enhancing the time-bandwidth performance of the analyzer.

And further, another object is to provide an improved laser-driven optical RF spectrum analyzer having a novel combined signal receiving and arcuate-signal transducer means for detecting and receiving a signal to be analyzed; such that depending upon the particular novel combined means used in the improved analyzer, it is capable of analyzing detected RF signals up to multi-gigahertz in frequency.

In summary, the improved compact and rugged optical RF spectrum analyzer of the invention is of one-piece slab-like configuration and integrated design. The analyzer is generally made up of a substrate of a suitable material, such as $LiNbO_3$; where the top surface of the substrate thereof has a predetermined uniform thickness or depth throughout its areal extent and is provided with a dopant such as titanium so as to form an optical waveguide having a higher refractive index than the non-doped portion of the substrate.

One end of the waveguide is provided with a light source, e.g., a laser, appropriate collimating lens means and enhanced surface diffraction grating means. The grating means is made up of a series of differently and relatively spaced grating lines all of uniform length such that the grating means are arranged between the lens means and the opposed edge of the waveguide. The spacing between adjoining grating lines progressively increases from the inner end of the grating means to the outer end thereof so that the collimated source beam at one end of the waveguide means is selectively diffracted, deflected, expanded and focussed (converging) toward the opposed end thereof. Each grating line means is preferably of a length longer than any spacing between adjoining grating line means and is preferably disposed at an angle of forty-five degrees (45°) to the optical axis extending between the source beam and the outer end of the diffraction grating means. Also, each grating line means may be integrally formed to the desired depth (thickness) and composition such as by etching into or depositing onto the waveguide top surface at its desired location so that any grating line has the desired refractive index as well as reflection/transparent characteristics. One suitable material for any grating line is $As_2S_3$. One of the advantages of the grating line means in being progressively spaced is that the source beam is chirped in phase, with the rate of chirping being proportional to the number of grating line means for a diffraction grating means of an analyzer.

Detector array means are provided at the opposed end of the waveguide. A novel combined signal detection and arcuate-shaped transducer means is provided for detecting and receiving one or more signals to be analyzed and for forming in response to these signals a surface acoustic wave (SAW). The combined means is disposed along one edge of the waveguide and is interposed between the detector array means and the diffraction grating means. The waveguide is optically transmissive to the acoustic wave generated by the combined means. The acoustic wave functions to optically intercept and deflect in Bragg-Cell-like fashion the converging beam so as to deflect same in proportion to one or more signals detected by the combined means during analyzer use. As the result of this deflection, the detector array means receives the further deflected beam that enables the analysis of the frequency distribution and intensity of one or more signals detected by the combined means as now represented by the deflected beam.

Depending on the requirements of the analyzer, a novel second diffraction grating means also made up of a series of grating line means may be interposed between the first diffraction grating line means and the transducer means of the combined means. One of the purposes of the second diffraction grating means is to compensate for aberrations in the diffracted beam of the first diffraction grating means such as errors in phase and amplitude that tend to generate interference such as cross talk between channels in the output of the detector array means. Regardless of whether one or two diffraction grating means are used in the analyzer, the transducer means of the combined means is always disposed immediately adjacent to first or second diffraction grating means for enabling surface acoustic wave exposure to substantially the full extent of the expanded/diffracted (E/D) beam; thereby enhancing the time-bandwidth performance of the analyzer. Since no focussing lens is required by the analyzer, its length is maintained at a minimum thereby minimizing manufacturing problems in forming the analyzer.

Other objects and advantages of the invention will become more apparent when taken in conjunction with the accompanying specification and drawings as follows:

DETAILED DESCRIPTION OF THE INVENTION

Figure 1:
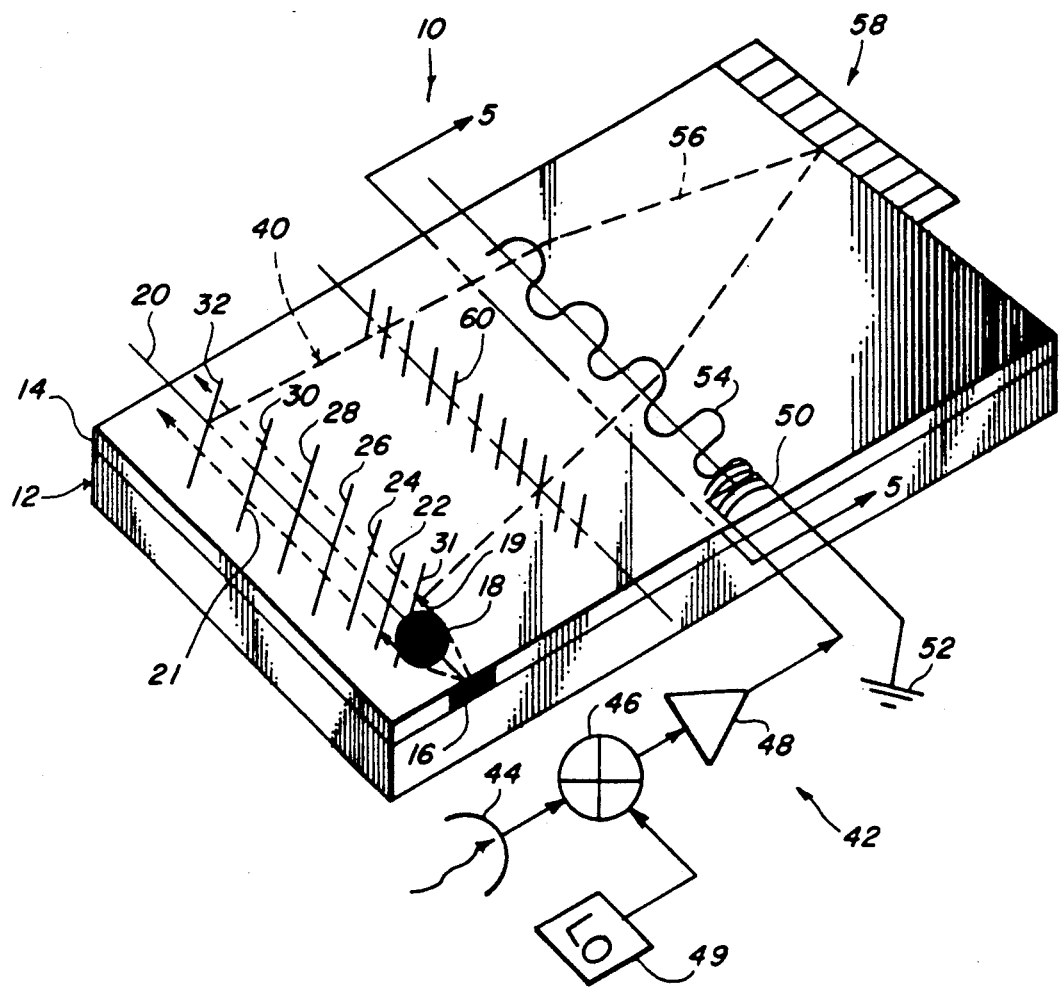
FIG. 1 is an enlarged combined diagrammatic and perspective view in dotted and solid lines of an embodiment of an improved compact optical RF spectrum analyzer.

With further reference to FIG. 1, an improved compact and rugged optical RF spectrum analyzer 10 is illustrated. The analyzer is generally made up of a one-piece slab-like optical waveguide 12. The waveguide is generally composed of a suitable material such as $LiNbO_3$. The upper portion 14 of the waveguide is formed to a suitable uniform depth throughout its areal extent. The upper portion is also provided with a dopant, titanium, so that the refractive index of the upper portion is greater than the lower portion and is optically transmissive to both a source beam and a surface acoustic wave all provided by the analyzer of integrated construction.

The analyzer at one end and along one edge thereof is provided with a suitable laser beam source 16 and a suitable collimating lens 18 such as a thin film Luneburg-type lens which is integrally formed on the waveguide. Source 16 and lens 18 are centered and relatively spaced along an optical axis 20 that extends generally transverse of the waveguide 12 and parallel to the one end thereof. Moreover, the source and lens 18 cooperate during use of analyzer 10 to form a collimated beam 19 that extends between the lens and the opposed edge of waveguide 12.

Figure 2:
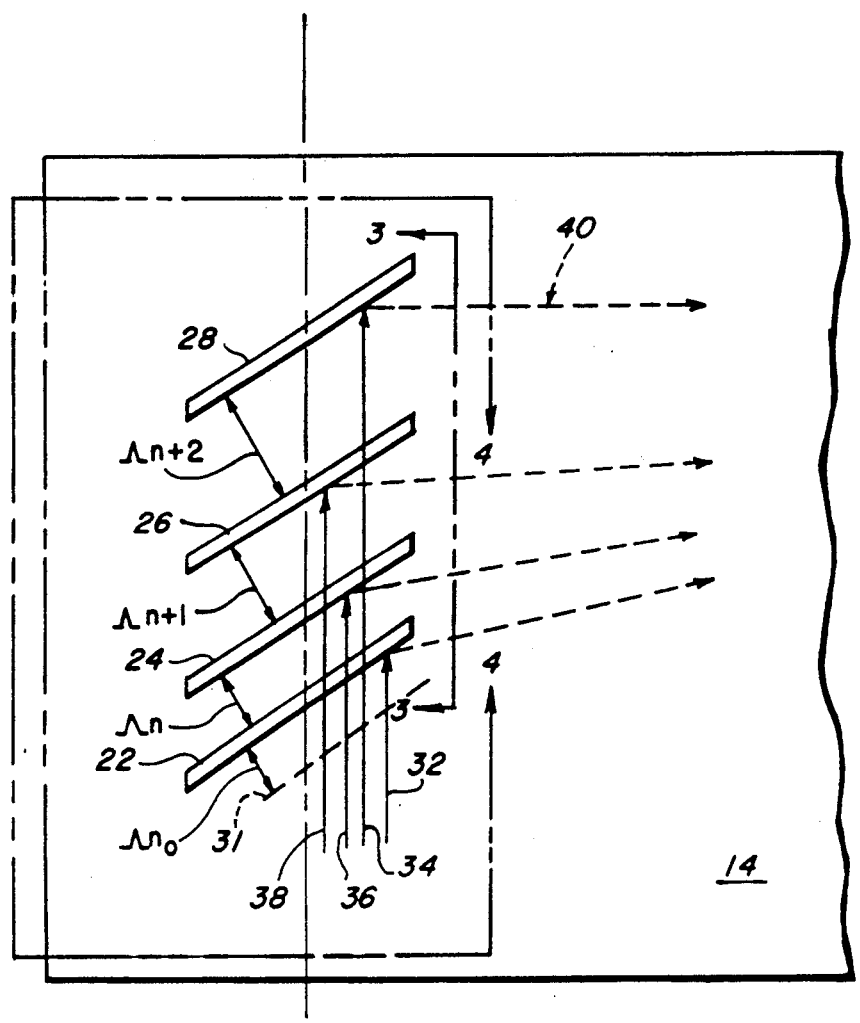
FIG. 2 is an enlarged top view of FIG. 1 in dotted and solid lines, with parts added and with other parts removed; and it illustrates further details of the enhanced source-beam diffraction grating means of the analyzer.

A surface diffraction grating means 21 is made up of a series of grating line means. The number of grating line means of the grating means is of course dependent upon the design requirements and intended use of the analyzer. Accordingly, as illustrated in FIG. 1, the grating means is generally made up of a series of six diffraction grating line (GL) means 22, 24, 26, 28, 30 and 32. Each grating line means is preferably disposed at forty-five degree (45°) in relation to axis 20. Adjoining grating line means are spaced from each other such that the spacing progressively increases from the lens or inner end of the grating line means to the outer end thereof as best shown in FIG. 2. The spacing between the innermost line means 22 to the outer periphery of lens means 18 is the narrowest as evidenced by the spacing distance between line means 22 and a forty-five degree parallel imaginary line 31 that is arranged tangent to the outer periphery of the lens means. The GL means are preferably all of uniform or the same length and the length of each GL means is selected so that the length of any GL means is greater than the spacing between the outermost GL means of the series and the adjoining inner GL means thereof.

Figure 3:
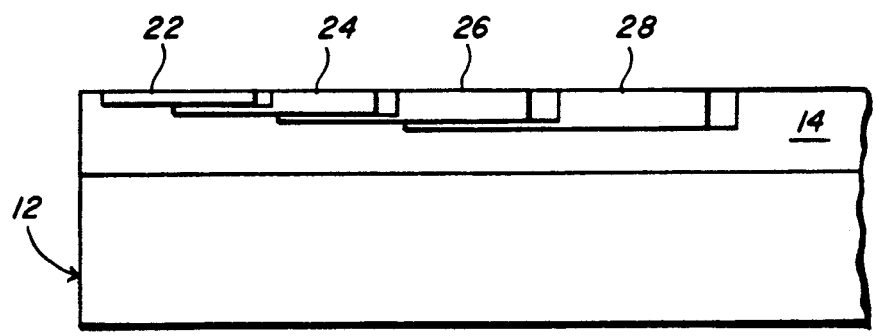
FIG. 3 is an enlarged cross sectional and elevational view with parts added and other parts removed as taken along line 3—3 of FIG. 2; and it illustrates further details of the diffraction grating means.

Each GL means may be formed of an appropriate refractive/reflective material having desired properties in accordance with the invention, such as $As_2S_3$. As best illustrated in FIG. 3, each GL is of a preselected depth and width; and may be formed by precisely depositing $A_2S_3$ onto the top surface of waveguide 14 at a selected area thereof. Depending on the properties desired for each grating line means, photo lithographic techniques may be used such as ultra violet light. Although not shown in FIG. 2 the upper or opposed side edge of waveguide portion 14 may be provided with a black body for absorbing any spurious light from the outer end of diffraction grating mens along axis 20 that might interfere with other portions of an integrated circuit design (not shown).

As further illustrated in FIG. 2 a collimated source beam is made up of a series of rays only a few of which are shown for the sake of brevity such that one ray 33 is reflected (deflected) by a GL means 22, another ray 34 by another GL means 28, another ray 36 by GL means 24, another ray 38 by GL means 26, etc.; all at different deflection angles. This deflection selectively diffracts a collimated source beam along the full length of the diffraction grating means in relation to axis 20 so as to form an expanded diffracted beam 40 that is also Fourier transformed thereby converging the diffracted beam as it is focussed along the length or longitudinal extent of the analyzer as shown by dotted lines in FIGS. 1-2. It is noted here that the focal length of the converging/diffracted beam is related to the spacing between adjoining GL means of the series of GL means of diffraction grating means 21 as the beam propagates through the diffraction grating means and the rays thereof are selectively chirped in phase by the GL means. In other words, as each ray of a beam is intercepted and deflected by each GL means of the series, e.g., GL means 22, each phase of a multiphase ray of the beam is chirped as it is intercepted and deflected by a GL means. Since the spacing between adjoining GL means of the series of GL means is different and progressively increases from the inner to the outer end of the diffraction grating means, each phase of a sinusoidal-shaped ray of the beam is chirped differently by each GL means of the series as it is intercepted and deflected thereby during analyzer use. As will be more fully discussed in the paragraphs immediately below, the deflection angle of any phase of each ray of the beam as it is chirped by a GL means is related to the spacing between adjoining GL means. Further, the chirp rate for each series of GL means is dependent on the number of GL means for each series. Thus, increasing the number of GL means for diffraction grating means 21 of a waveguide 12; the chirp rate thereof is increased. Hence, as will become more apparent hereinafter, depending on the number of GL means for a series thereof to form a diffraction grating means not only is the chirp rate affected but the deflection angles of the deflected/converging rays of the expanded/converging beam 40 along with the focal length thereof are also affected as well.

Figure 4:
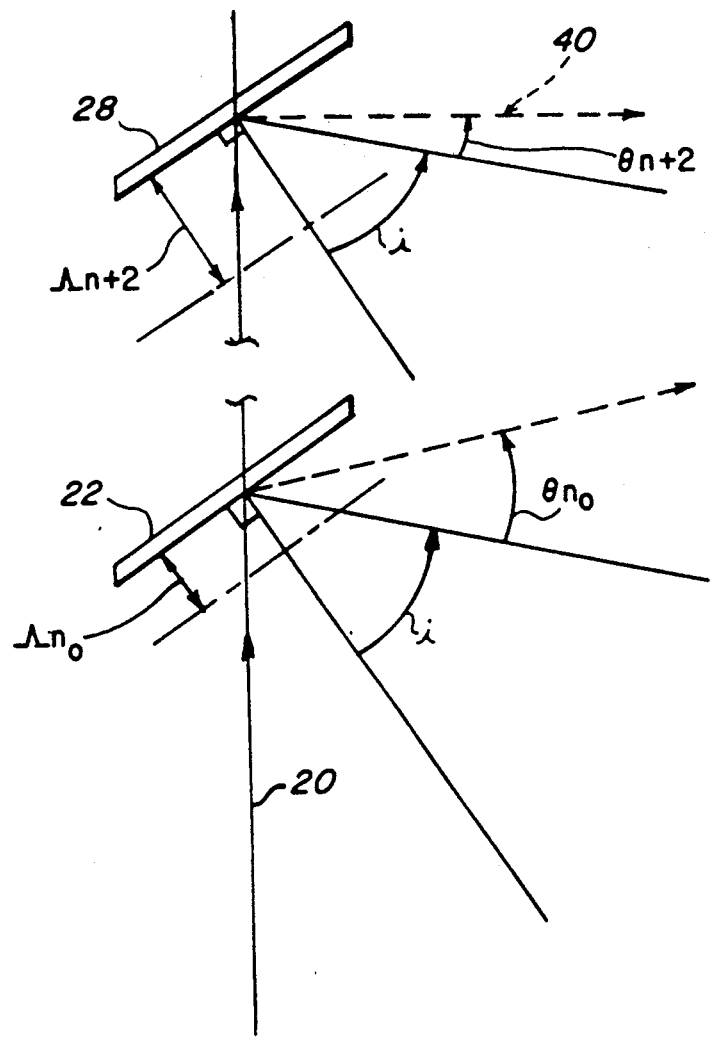
FIG. 4 is a top schematic view as taken within the bounds of encompassing line 4—4 of FIG. 2 and in dotted and solid lines, with parts added and with other parts removed; and it illustrates further details of the invention.

With further reference to FIG. 4, the spacing between any adjoining GL means of the series of GL means 21 can be mathematically expressed by the equation:

$$\text{Sine } \Theta_n = \frac{\lambda}{\eta \Lambda} - \text{Sine } i \text{ or } \Theta = \text{Sine}^{-1}\left[\frac{\lambda}{\eta \Lambda} - \text{Sine } i\right]$$

where $\lambda$ is the wavelength of a given source beam 19, where $\Theta_n$ is the diffraction (deflection) angle of any GL means of the series of GL means of diffraction grating means 21 of waveguide 12 as the result of the spacing between a given GL means of the series and its associated adjoining GL means thereof that is disposed immediately prior to the given GL means along optical axis 20, where $\eta$ is the refractive index of any GL means of waveguide 12 for which the deflection or diffraction angle $\Theta_n$ is being determined, where $\Lambda$ is the spacing between a GL means and an immediately prior GL means of the series; and where $i$ is the angle of offset of any GL means such that the angle of offset occurs where any GL means of waveguide 12 is not perpendicular to the rays of source beam 19. In solving the above equations for $\Lambda$, it is evident that:

$$\Lambda = \frac{\lambda}{\eta[\text{sine } \Theta_n + \text{sine } i]}$$

It is evident from the equations that as the spacing increases between adjoining GL means that the diffraction angle decreases. Thus, the magnitude of the diffraction angle is inversely proportional to the spacing between adjoining GL means. In view of the linear and inverse relation between angle $\Theta$ and spacing $\Lambda$, it should be apparent that the geometric size, length and width of waveguide 12 can be readily determined and designed (tailored) to meet any particular requirements as it is used. In other words, by determining the number of GL means for a given diffraction means 21, not only is the spacing determined between adjoining GL means but also the deflection angle for each GL means, the chirp rate for the give diffraction grating means and the focal length of convergent/expanded beam 40 so that it will appropriately impact, with minimal interference effects, a detector array means of analyzer 10 during its use.

Figure 5:
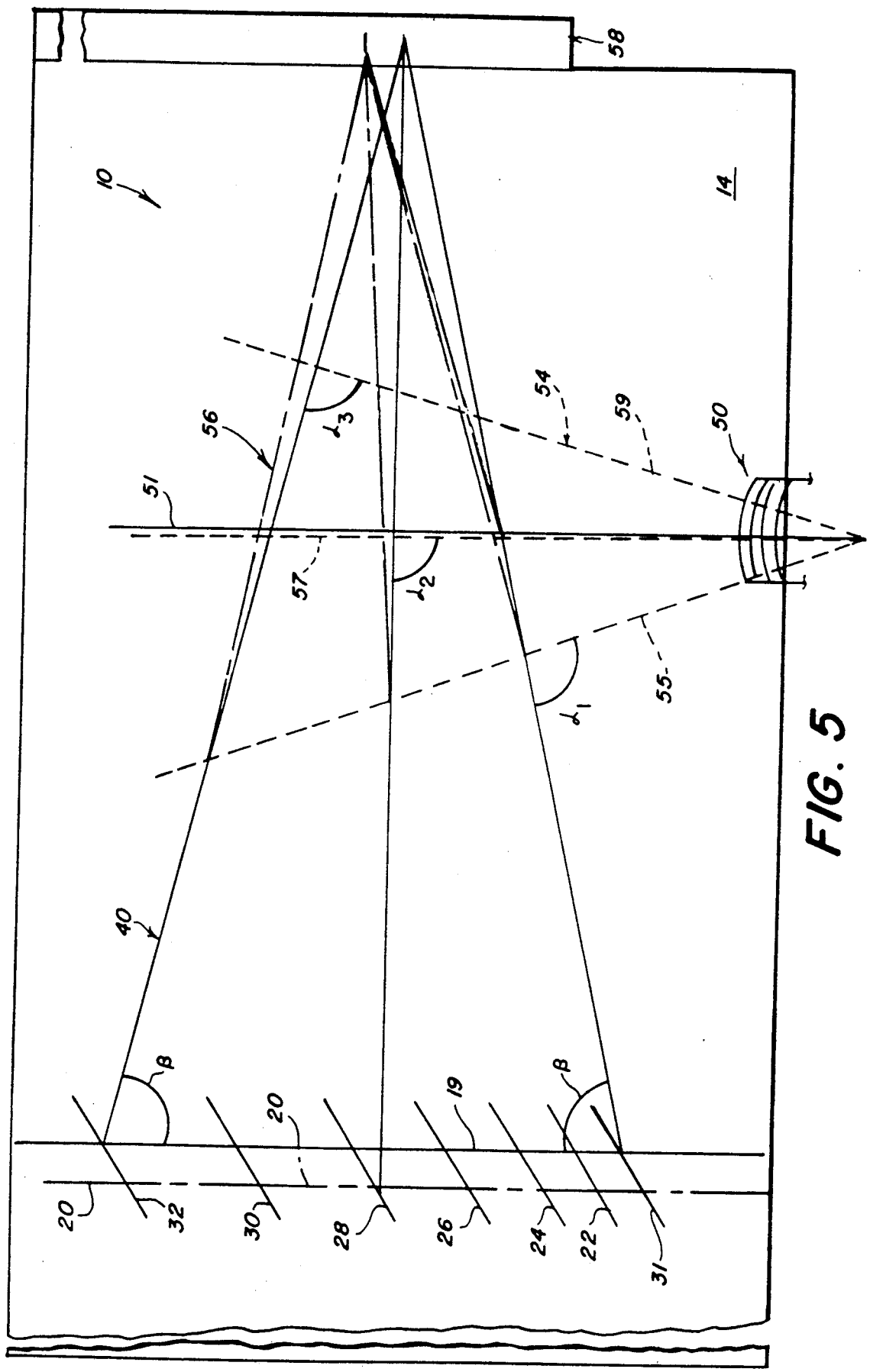
FIG. 5 is an enlarged diagrammatic view taken within the bounds of encompassing line 5—5 of FIG. 1 and in dotted and solid lines, with parts added and with other parts removed; and it illustrates further details of the invention.

Combined signal detecting (receiving) and arcuate-shaped transducer (CSD/AT) means 42 for detecting one or more signals to be analyzed by analyzer 10 during its use is operatively associated with waveguide 12 in the manner illustrated in FIG. 1. The combined means 42 is generally made up of antenna signal receiving means 44, mixer means 46, amplifier means 48 and signal transducer (ST) means 50, with all means being series interconnected. A suitable oscillator 49 is connected to the mixer means 46 for downwardly converting one or more signals detected by antenna means 44 during analyzer use. Transducer means 50 is interposed between opposed ends of the waveguide means 12 and is integrally connected to top portion 14 along the one edge thereof. The transducer means 50 is preferably made up of an array of an opposed series of relatively spaced electrodes of arcuate or curved shape such that one series is connected to the output of amplifier means 48 and the other series is connected to ground 52. As best depicted in FIG. 5, each series of electrodes is made up of a pair of electrodes that are uniformly spaced relative to each other and centered relative to longitudinal axis 51 of transducer means 50 that extends transversely of waveguide 12 between its ends.

Each electrode of either series is of uniform circular shape such that the radial spacing or extent between adjoining electrodes of the opposed series is constant. The uniform arcuate extent of any electrode of the opposed series of electrodes is chosen so that the outward diverging traveling surface acoustic waves (SAW) or wave pattern 54 generated by the series of electrodes of transducer means 50 during analyzer use intercepts each ray of converging/diffracted beam 40 so as to modulate and deflect same (further diffract) as represented by deflected portion 56 of beam 40 as best shown in FIG. 5. It has been found, by virtue of the arcuate-shaped electrodes of transducer means 50, that traveling/outwardly divergent SAW 54 generated thereby provides enhanced interception and modulation of each ray of beam 40 as it is deflected in the manner indicated by beam portion 56 so that there is maximum diffraction efficiency. It is evident from FIG. 5 that the rays of SAW 54, as represented by exemplary center ray 57 and both outer rays 55 and 59 thereof, intercept any ray of beam 40 at equal angles $\alpha_1$ $\alpha_2$ and $\alpha_3$. The magnitude of the angular extent of the divergent SAW substantially matches the angular extent of the outer rays of convergent/diffracted (C/D) beam 40 as represented by angle $\beta$. If transducer means 50 were designed without an arcuate-shaped profile so as to be straight, then the waves generated by the traveling SAW would be collimated and not as effective as a novel traveling SAW of outwardly divergent shape for intercepting (C/D) beam 40.

Detector array means 58 is affixed to the opposed end of top portion 14 as depicted in FIG. 1. The array means 58 is made up of a series of array elements 61 such that each array element serves to detect, analyze and indicate one or more signals at a given frequency and amplitude when impinged upon by the focussed output of an optically diffracted beam whereby the detector array means 58 provides a combined output of the frequency spectrum and intensity of one or more signals detected by the analyzer during its use. It is to be understood that even though only one acoustic-optical diffracted/focussed beam 56 is shown in FIG. 1 that during use of analyzer 58 one or more acousto-optical beams could move between one or more array elements of the array means so that the output of the detector array means would indicate the frequency spectrum and intensity of one or more signals detected by combined means 42 during analyzer use.

Depending upon the requirements of analyzer 10, second surface diffraction grating means 60 may be interposed between ST means 50 and first diffraction grating means 21. As with first diffraction grating means 21, the second diffraction grating means is also made up of a series of etched grating line (GL) means. One of the purposes of the second diffraction grating means 60 is to compensate for aberrations in expanded/diffracted beam 40 such as errors in phase and amplitude in the rays of the beam that would generate interference in the way of cross talk between channels, thereby causing it to be difficult to effectively or precisely analyze results in the output of the detector array means during analyzer use. Accordingly each GL means of the second diffraction grating means can be precisely formed as to thickness, width and length as well as refraction characteristics so as to effectively compensate for errors in diffracted/expanded beam 40. Although a second diffraction grating means is shown in FIG. 1, it is to be understood that other phase correcting techniques can be used.

With or without second diffraction grating means 60 being part of analyzer 10, it is evident that ST means 50 can be arranged immediately adjacent to the output of second diffraction grating means 60 as shown in FIG. 1 or immediately adjacent to the output of first diffraction grating means 21. Because of this immediate adjacency, the traveling SAW output of the AT means substantially intercepts the full extent or diameter of expanded/diffracted beam 40 thereby maximizing the time-bandwidth performance characteristics of analyzer 10.

Although not heretofore mentioned, the analyzer is limited to analyzing detected signal frequencies up to two giga Hertz (2.0 GHz) because of attenuations that occur in the SAW at higher frequencies as formed by ST means 50. However, the analyzer can be readily modified to incorporate antenna means (not shown) that are integrally formed in top portion 14 (now consisting of a magneto optic material such as yttrium iron garnet) and appropriately connected to the output of amplifier means 48 (FIG. 1) so as to generate magneto static wave means in response to detected signals obtained by combined means 42. When antenna means are used by the top portion of analyzer 10, it is capable of analyzing detected signals up to 20.0 GHz. Such an antenna can either be a curved strip-line profile with the arcuate extent being circular as in the case for any electrode of transducer 50 or of a straight strip line profile such that the wavelength of a magnetostatic wave generated by the straight strip line antenna is larger than the length of the straight strip line antenna itself. Regardless of the shape of the antenna for generating a magneto static wave for interacting with converging rays of C/D beam 40, the angular extent of the magnetostatic wave as generated by an antenna in relation to any ray of beam 40 at the area of intercept during use of the improved analyzer should be such as to substantially match the angular extent of beam 40 as depicted in FIG. 5.

Obviously, many modifications and variations of the present invention are possible in light of the above teachings. It is therefor to be understood that, within the scope of the appended claims, the invention may be practice otherwise than as specifically described.

What is claimed and desired to be secured by Letters Patent of the United States is:

1. An RF spectrum analyzer for detecting and determining the frequencies of a microwave signal, the analyzer comprising:
   waveguide means having opposed ends and opposed sides extending therebetween, the waveguide means being made up of a solid and optically transmissive material and having base means and upper portion means,
   light source for producing a light beam of a particular wavelength,
   said light source means being disposed along one side of the waveguide means and arranged adjacent one end thereof, the light source means being also arranged to project the light beam in one direction along a continous path into and through the upper portion means of said waveguide means where the path extends between the opposed sides of the waveguide means and is located adjacent the one end thereof, collimating lens means being located in the path of the light beam and having a light beam input and a collimated beam output, said lens means being arranged immediately adjacent to the light source means and formed on the upper portion means of the waveguide means so that the light beam enters the input of the lens means and exists the output thereof as a collimated beam of collimated rays, surface diffraction grating SDG means comprised of a series of differently and relatively spaced grating line GL means formed along the continuous path such that the series of GL means are located in the path of the collimated beam after it exits from the lens means output with the inner end of the SDG means being located adjacent the lens means output and with the outer end thereof being located adjacent the opposed side of the waveguide means; the light source means, lens means and series of GL means of the SDG means having a common optical axis extending there between, each GL means of the series being constructed and arranged on the upper portion means of the waveguide means so as to be contacted by various collimated rays of the light beam as the beam propagates through the SDG means, each Gl means of the series being arranged at a corresponding predetermined acute angle in relation to the optical axis and the collimated beam such that any adjoining GL means of the series are soaced differently from each other than any other adjoining Gl means of the series so that the spacing between adjoining GL means thereof progressively increases from the inner end of the SDG means to the outer end thereof in order to provide an emerging, expanded and deflected E/D beam as it exists in a direction from the SDG means that is generally transverse to the optical axis and toward the opposed end of the waveguide means and to provide the emerging E/D beam with a diameter substantially equal to the length of the SDG means between the inner and outer GL means thereof and with the E/D beam being Fourier transformed so as to converge and focus toward the opposed end of the waveguide means all as the result of the progressively increasing spacing between adjoining GL means of the SDG means, detector array means comprised of a series of detector means with each detector means of the series for detecting an RF signal of different frequency including its intensity, the detector array means being disposed at the opposed end of the waveguide means and arranged at the focal plane of the SDG means so that one or more of the detector means of the array means is irradiated by the E/D beam during analyzer use, and combined signal detection and transducer means, the signal transducer ST means of the combined means being disposed on one side of the upper portion means of the waveguide means and interposed between the SDG means and the detector array means, the ST means for generating and transmitting a traveling SAW through the upper portion means in a direction generally transverse of the upper portion means and toward the opposed side thereof so as to intercept and further deflect the E/D beam in response to one or more signals detected by the combined means whereby the further deflected E/D beam irradiates one or more detector means of the detector array means in order that the detector array means may analyze one or more signals as to frequency distribution and intensity during analyzer use.

2. An analyzer as set forth in claim 1 wherein the combined means is generally made up of signal receiving antenna means, mixer means, oscillator means and amplifier means.

3. An analyzer as set forth in claim 1 wherein each GL means of the series of GL means of the SDG means are disposed at an angle of approximately forty-five degress (45°) in relation to the common optical axis of the waveguide means.

4. An analyzer as set forth in claim 1 wherein the ST means is comprised of an opposed series of electrodes, and wherein each one of the electrodes of the opposed series is of arcuate-shape.

5. An analyzer as set forth in claim 4 wherein the ST means generates a travelling SAW of outwardly divergent shapes.

6. An analyzer as set forth in claim 1 wherein the deflection angle of a given GL means of the series of GL means of the SDG means together with the particular spacing between the given GL means and its adjoining GL means in the direction toward the inner end of the SDG means is determined by the equation:

$$\sin\theta = \frac{\lambda}{\eta\Lambda} - \sin i,$$

where $\Theta$ is the deflection angle between a given GL means and the common optical axis, where $\lambda$ is the wavelength of any ray of the light source means, where $\eta$ is the refractive index of a given GL means, and where $\Lambda$ is the spacing between a given GL means and its adjoining GL means in the direction toward the inner end of the SDG means, and where "i" is the angle of offset of any GL means such that the angle of offset occurs when any GL means of the waveguide means is not perpendicular to the rays of the collimated beam.

7. An analyzer as set forth in claim 4 wherein the spacing between the innermost GL means of the series of GL means of the SDG means and the lens means output is located between an imaginary line that is tangent to the outer periphery of the lens means output as well as the imaginary line being parallel to the innermost GL means.

8. An analyzer as set forth in claim 1 wherein the upper portion means and the base means of the waveguide means have different refractive indices, and wherein the refractive index of the upper portion means is greater than the refractive index of the base means.

9. An analyzer as set forth in claim 1 wherein the upper portion means and the base means are essentially composed of $LiNbO_3$ and wherein the upper portion means is also composed of a dopant, titanium (Ti).

10. An analyzer as set forth in claim 1 wherein each GL means of the series of GL means of the SDG means is of substantially uniform length and of substantially corresponding shape in transverse section.

11. An analyzer as set forth in claim 1 wherein the upper portion means has exposed surface mmeans; and wherein each GL means of the series of GL means of the SDG means are formed by etching to a desired depth and width on the exposed surfaced means of the upper portion means.

12. An analyzer as set forth in claim 1 wherein each GL means of the series of GL means of the SDG means is essentially comprised of $AS_2S_3$.

13. An analyzer as set forth in claim 1 wherein each Gl means of the series of GL means of the SDG means is of different width and depth so as to provide the desired reflective/transparent characteristic therefor, and wherein each GL means has predetermined refractive index characteristics as well.

14. An analyzer as set forth in claim 1 wherein the narrowest spacing of the SDG means occurs between the innermost GL means of the series of GL means of the SDG means and the lens means output.

15. An RF spectrum analyzer for detecting and determining the frequencies of a microwave signal, the analyzer comprising:
  waveguide means having opposed ends and opposed sides extending therebetween the waveguide means being made up of a solid and optically transmissive, material and having base means and upper portion means,
  light source means for producing a light beam of a particular wavelength,
  said light source means being disposed along one side of the waveguide means and arranged adjacent one end, thereof, the light source means being also arranged to project the light beam in one direction along a continuous path into and through the upper portion means of said waveguide means where the path extends between the opposed sides of the waveguide means and is located adjacent the one end thereof,
  collimating lens means being located in the path of the light beam and having a light beam input and a collimated beam output, said lens means being arranged immediately adjacent to the light source means and formed on the upper portion means of the waveguide means so that the light beam enters the input of the lens means and exits the output thereof as a collimated beam of collimated rays,
  surface diffraction grating SDG means comprised of a series of differently and relatively spaced grating line GL means formed along continuous path such that series of GL means are located in the path of the collimated beam after it exits from the lens means output with the inner end of the SDG means being located adjacent the lens means output and with the outer end thereof being located adjacent the opposed side of the waveguide means; the light source means, lens means and series of GL means of the SDG means having a common optical axis extending therebetween,
  each GL means of the series being constructed and arranged on the upper portion means of the waveguide means so as to be contacted by various collimated rays of the light beam as the beam propagates through the SDG means, each GL means of the series being arranged at a substantially corresponding predetermined acute angle in relation to the optical axis and the collimated beam such that any adjoining GL means of the series are spaced differently from each other than any other adjoining GL means of the series so that the spacing between adjoining GL means thereof progressively increases from the inner end of the SDG means to the outer end thereof in order to provide an emerging, expanded and deflected E/D beam as it exits in a direction from the SDG means that is generally transverse to the optical axis and toward the opposed end of the waveguide means and to provide the emerging E/D beam with a diameter substantially equal to the length of the SDG means between the inner and outer GL means thereof and with the E/D beam being Fourier transformed so as to converge and focus toward the opposed end of the waveguide means all as the result of the progressively increasing spacing between adjoining GL means of the SDG means,
  detector array means comprised of a series of detector means with each detector means of the series for detecting an RF signal of different frequency including its intensity, the detector array means being disposed at the opposed end of the waveguide means and arranged at the focal plane of the SDG means so that one or more of the detector means of the array means is irradiated by the E/D beam during analyzer use,
  combined signal detection and transducer means, the signal transducer (ST) means of the combined means being disposed on one side of the upper portion means of the waveguide means and interposed between the SDG means and the detector array means, the ST means for generating and transmitting a SAW through the upper portion means in a direction generally transverse of the upper portion means and toward the opposite side thereof so as to intercept and further deflect the E/D beam in response to one or more signals detected by the combined means whereby the further deflected E/D beam intercepts one or more detector means of the detector array means in order that the detector array means may analyze one or more signals -as to frequency distribution and intensity during analyzer use, and
  second surface diffraction grating SDG means interposed between the first SDG means and the ST means and arranged in alignment with the E/D beam as it emerges from the first SDG means, the second SDG means having an optical axis extending between the opposed sides of the waveguide means, the second SDG means being comprised of a series of grating line GL means formed on the upper portion means of the waveguide means and in relation to the optical axis of the second SDG means, each GL means of the second SDG means being angularly disposed and selectively arranged relative to the optical axis of the second SDG means and relative to its associated GL means of the first SDG means so as to compensate for any aberration in the converging rays of the E/D beam prior to the E/D beam being intercepted and optically diffracted by the SAW of the ST means during analyzer use.

16. An analyzer as set forth in calim 15 wherein each GL means of the first and second SDG means is essentially comprised of $AS_2S_3$.

* * * * *